United States Patent
Kim

(10) Patent No.: US 7,423,878 B2
(45) Date of Patent: Sep. 9, 2008

(54) PLASMA DISPLAY PANEL ASSEMBLY

(75) Inventor: Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 276 days.

(21) Appl. No.: 11/158,541

(22) Filed: Jun. 22, 2005

(65) Prior Publication Data
US 2005/0286228 A1  Dec. 29, 2005

(30) Foreign Application Priority Data
Jun. 24, 2004  (KR) .................. 10-2004-0047641

(51) Int. Cl.
*H05K 7/20* (2006.01)
*G02F 1/1333* (2006.01)

(52) U.S. Cl. .................. 361/704; 361/707; 349/58; 345/905

(58) Field of Classification Search .............. None
See application file for complete search history.

(56) References Cited

U.S. PATENT DOCUMENTS

| | | | | |
|---|---|---|---|---|
| 5,831,374 A * | 11/1998 | Morita et al. | .................. | 313/46 |
| 6,067,133 A * | 5/2000 | Niibori et al. | .................. | 349/60 |
| 6,366,264 B1 * | 4/2002 | Kurumada | .................... | 345/60 |
| 6,366,459 B1 * | 4/2002 | Katagiri | ...................... | 361/686 |
| 6,373,702 B2 * | 4/2002 | Oishi et al. | .................. | 361/704 |
| 6,411,353 B1 * | 6/2002 | Yarita et al. | ................... | 349/59 |
| 6,477,039 B2 * | 11/2002 | Tajima | ........................ | 361/681 |
| 6,483,567 B1 * | 11/2002 | Okada | .......................... | 349/158 |
| 6,512,558 B2 * | 1/2003 | Kim | ............................. | 349/58 |
| 6,633,126 B1 * | 10/2003 | Tsai et al. | ..................... | 313/582 |
| 6,774,872 B1 * | 8/2004 | Kawada et al. | ................ | 345/60 |
| 2004/0141101 A1 * | 7/2004 | Osu et al. | ..................... | 349/58 |
| 2006/0012962 A1 * | 1/2006 | Obata | ......................... | 361/704 |

FOREIGN PATENT DOCUMENTS

| | | |
|---|---|---|
| JP | 02-202729 | 8/1990 |
| JP | 1999-296094 | 10/1999 |

OTHER PUBLICATIONS

The First Office Action by The State Intellectual Property Office of P.R. China issued Mar. 14, 2008.

\* cited by examiner

*Primary Examiner*—Boris L Chervinsky
(74) *Attorney, Agent, or Firm*—Knobbe Martens Olson & Bear LLP

(57) ABSTRACT

A plasma display panel (PDP) assembly with an air gap for improving heat dissipation is disclosed. In one embodiment, the PDP assembly includes: a panel assembly having a front panel and a rear panel coupled to the front panel, a chassis base supporting the panel assembly; a driving circuit unit attached on a back surface of the chassis base, and a flexible printed cable, one end of which is connected to an electrode terminal of the panel assembly and the other end connected to a connector of the driving circuit unit, configured to transmit circuitry driving signals. In addition, an air gap is formed between the panel assembly and the chassis base.

17 Claims, 8 Drawing Sheets

PLASMA DISPLAY PANEL ASSEMBLY

CROSS-REFERENCE TO RELATED APPLICATION

This application claims the priority of Korean Patent Application No. 10-2004-0047641, filed on Jun. 24, 2004, in the Korean Intellectual Property Office, the disclosure of which is incorporated herein in its entirety by reference.

BACKGROUND OF THE INVENTION

1. Field of the Invention

The present invention relates to a plasma display panel assembly, and more particularly, to a plasma display panel assembly in which an air gap is formed between a panel assembly and a chassis base to improve a heat dissipation efficiency.

2. Description of the Related Technology

In general, a plasma display panel assembly is a flat panel display device including a plurality of substrates having discharge electrodes formed on facing surfaces thereof. A discharge gas is injected into a sealed discharge space between the substrates, and predetermined voltages are applied to the discharge electrodes to generate ultraviolet rays that excite a fluorescent material of a phosphor layer, thus displaying an image using visible light emitted from the excited fluorescent material.

The plasma display panel assembly also includes a front panel and a rear panel coupled to each other, a chassis base attached to the panel assembly, a driving circuit unit transmitting electric signals to the panel assembly and mounted on a surface of the chassis base. All these components are installed in a case.

FIG. 1 is a perspective view of a plasma display panel assembly disclosed in Japanese Patent Publication 02-202729.

Referring to FIG. 1, a plasma display panel assembly 100 includes a frame chassis 110, on which a driving circuit unit (not shown) is installed, a plasma display panel 120 disposed on a front surface of the frame chassis 110 and formed by coupling two glass substrates, and a heat transmission sheet 130 disposed between the frame chassis 110 and the plasma display panel 120.

The heat transmission sheet 130 is formed by arranging a plurality of sheets 150. In addition, a dual-adhesive tape 140 is disposed between the frame chassis 110 and the plasma display panel 120.

Since the plasma display panel assembly 100 includes the heat transmission sheet 130 between the frame chassis 110 and the plasma display panel 120, the heat transmission sheet 130 can be easily adhered to the plasma display panel 120, and thus heat transmission efficiency can be uniform throughout the entire area of the plasma display panel 120.

However, the heat generated from the driving circuit unit supported by the frame chassis 110 may be transmitted to the plasma display panel 120 by passing through the heat transmission sheet 130, and thus it may badly affect the plasma display panel 120.

In addition, a unit for dissipating the heat generated from an integrated circuit (IC) of the flexible printed cable (not shown) installed on the driving circuit unit is not included in the plasma display panel assembly 100.

A great deal of driving pulses are typically applied within a short time due to an enlarged plasma display panel assembly. Also, a tape carrier package (TCP) type, flexible printed cable including highly concentrated ICs is used for reducing the number of IC chips required to drive the plasma panel assembly. Those ICs generate more heat. Therefore, there has been a need for an effective heat dissipating unit to improve the reliability of the plasma display panel assembly.

SUMMARY OF CERTAIN INVENTIVE ASPECTS

One aspect of the present invention provides a plasma display panel assembly in which an air gap is formed between a panel assembly and a chassis base so that heat generated from a driving circuit unit is not transmitted to the panel assembly, and thus a heat dissipation efficiency can be improved.

Another aspect of the present invention provides a plasma display panel assembly in which an opening is formed on the chassis base and a flexible printed cable coupled to the chassis base through the opening so that a heat dissipation efficiency can be improved.

Another aspect of the present invention provides a plasma display panel assembly including: a panel assembly having a front panel and a rear panel coupled to the front panel; a chassis base supporting the panel assembly; a driving circuit unit attached on a back surface of the chassis base; and a flexible printed cable, one end which is connected to an electrode terminal of the panel assembly and the other end connected to a connector of the driving circuit unit for transmitting electric signals, wherein an air gap is formed between the panel assembly and the chassis base.

In one embodiment, the chassis base may include a main body separated a predetermined distance from the panel assembly in order to form the air gap, and a bent portion bent more than once from upper and lower ends of the main body to be coupled to the panel assembly.

In one embodiment, a heat dissipation sheet may be attached on the outer surface of the panel assembly that faces the main body so as not to contact the chassis base.

In one embodiment, an adhesive member having a heat dissipating property may be disposed between the bent portion and the panel assembly in order to fix the chassis base with respect to the panel assembly.

In one embodiment, the bent portion may include a penetration hole in order to receive the flexible printed cable inside thereof, and the flexible printed cable is installed through the penetration hole, wherein an end of the flexible printed cable is connected to a connector of the driving circuit unit and the other end is connected to a terminal of the panel assembly.

In one embodiment, a first adhesive member having a heat dissipation property may be disposed between the bent portion and an integrated circuit (IC) of the flexible printed cable so that the IC is fixed on the chassis base.

In one embodiment, the chassis base may include a main body disposed in parallel to the panel assembly, a bent portion bent more than once from the upper and lower ends of the main body, wherein a plate of a predetermined thickness is installed between the chassis base and the panel assembly in order to form an air gap in a state where a predetermined distance is maintained between the chassis base and the panel assembly.

In another embodiment, the chassis base may include a main body of plate type that is separated a predetermined distance from the panel assembly in order to form an air gap between the chassis base and the panel assembly, and a bent portion bent more than once from the upper and lower ends of the main body, wherein the flexible printed cable is installed inside the bent portion.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 2:
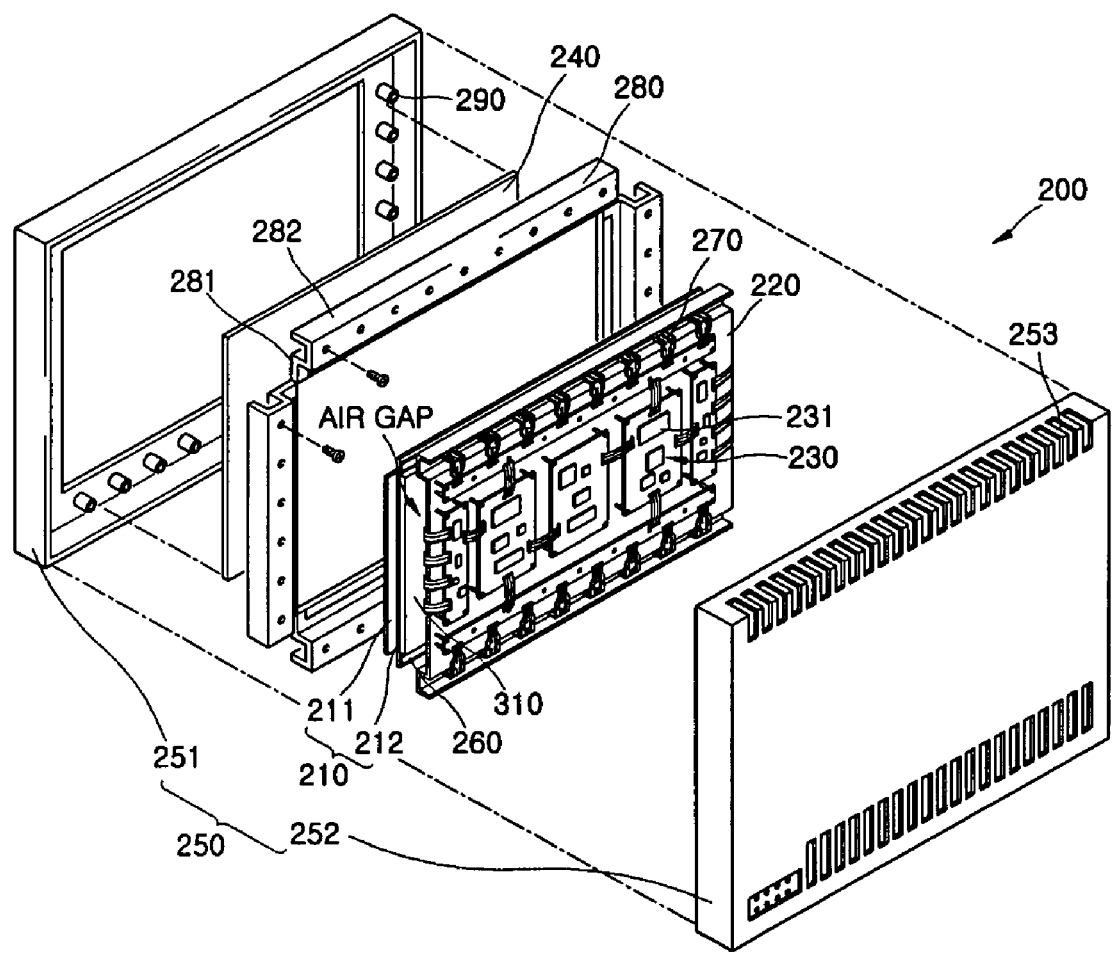
FIG. 2 is an exploded perspective view of a plasma display panel assembly according to a first embodiment of the present invention.

FIG. 2 is a perspective view of a plasma display panel assembly 200 according to a first embodiment of the present invention.

Referring to FIG. 2, the plasma display panel assembly 200 includes a panel assembly 210, a chassis base 220 installed on a rear potion of the panel assembly 210, a driving circuit unit 230 installed on a rear portion of the chassis base 220, a filter assembly 240 installed on a front portion of the panel assembly 210, and a case 250 receiving the panel assembly 210, the chassis base 220, the driving circuit unit 230, and the filter assembly 240.

The panel assembly 210 includes a front panel 211 and a rear panel 212 coupled to the front panel 211.

In case of a three-electrode surface discharge type plasma display panel, pairs of sustain electrodes including X and Y electrodes, a front dielectric layer covering the pairs of sustain electrodes, and a protective layer coated on the front dielectric layer are formed in the front panel 211. In addition, address electrodes crossing the pairs of sustain electrodes, a rear dielectric layer covering the address electrodes, barrier ribs installed on the rear dielectric layer, and red, green, and blue phosphor layers applied in the barrier ribs are formed in the rear panel 212.

The chassis base 220 is disposed on a rear portion of the panel assembly 210. The chassis base 220 is coupled to the panel assembly 210 via an adhesive member 260. In one embodiment, the chassis base 220 is made of a metal plate having high heat conductivity, for example, aluminum alloy. In one embodiment, a chassis enhancing member may be further installed on upper and lower portions of the chassis base 220 in order to reinforce the strength of the chassis base 210.

A plurality of driving circuit units 230 are installed on the back surface of the chassis base 220. A plurality of circuit devices 231 are mounted on the driving circuit unit 230. In addition, the flexible printed cable 270 is installed between the driving circuit unit 230 and the panel assembly 210. The flexible printed cable 270 electrically connects an electrode terminal of the panel assembly 210 to a connector of the driving circuit unit 230.

The filter assembly 240 is installed on a front portion of the panel assembly 210. The filter assembly 240 is installed to shield electromagnetic wave generated from the panel assembly 210, ultraviolet ray, neon light, or reflection of outer light.

A reflection prevention film for preventing visibility reduction of due to the reflection of outer light is adhered onto the filter assembly 240. An electric wave shielding layer is formed on the filter assembly 240 to shield the electromagnetic wave generated during driving of the panel assembly 210. A selective wavelength absorption film is installed on the filter assembly 240 in order to shield the neon light emission and unnecessary emission of near-infrared radiation due to the inert gas plasma used to emit the image.

The case 250 includes a front cabinet 251 installed on a front portion of the filter assembly 240 and a back cover 252 installed on a rear portion of the chassis base 220. A plurality of vent holes 253 are formed in upper and lower ends of the back cover 252.

In addition, a filter holder 280 is installed on a back surface of the filter assembly 240. The filter holder 280 includes a press portion 281 pressing the filter assembly 240 toward the front cabinet 251, and a fixing portion 282 that is bent from the press portion 282 toward the panel assembly 210. In addition, a filter mounting portion 290 is installed on an edge of the back surface of the front cabinet 251. The fixing portion 282 corresponds to the filter mounting portion 290, and the filter assembly 240 is fixed onto the front cabinet 251 by, for example, screws.

In one embodiment, a predetermined air gap is formed between the panel assembly 210 and the chassis base 220. In this embodiment, a heat dissipation sheet 310 is disposed on the back surface of the panel assembly 210, and the flexible printed cable 270 is coupled to the upper and lower ends of the chassis base 220.

The detailed structure of an embodiment will be described with reference to FIG. 3.

Hereinafter, the same reference numerals as those in the previous drawings denote the same elements having the same functions.

Figure 3:
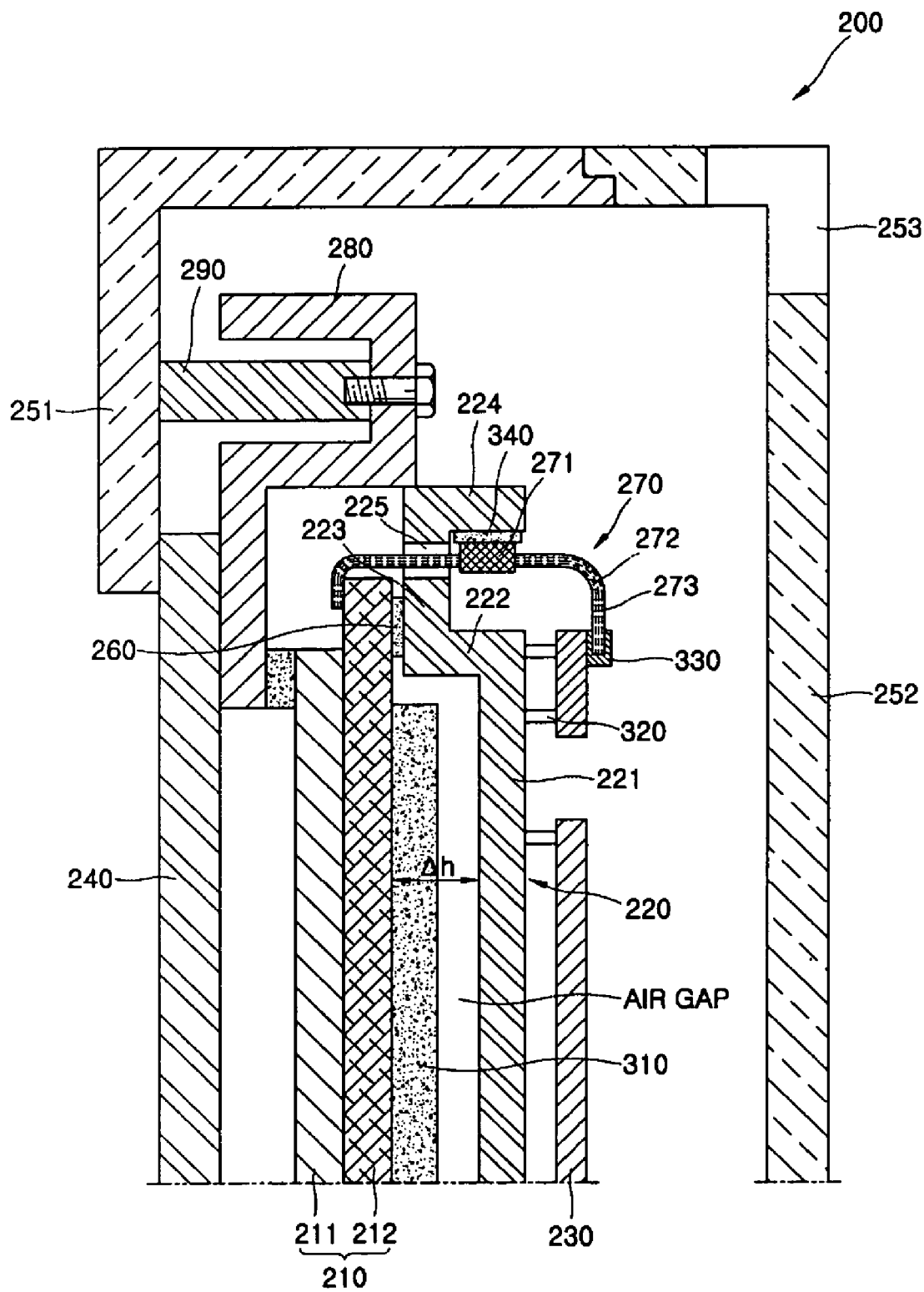
FIG. 3 is a cross-sectional view of a heat dissipation structure according to the first embodiment of the present invention.

Referring to FIG. 3, the plasma display panel assembly 200 includes the front cabinet 251 on the front portion of the filter assembly 240, and the back cover 252 installed on the rear portion of the chassis base 220. The panel assembly 210, the chassis base 220, the driving circuit unit 230, the filter assembly 240, and the other elements are received in a space formed by coupling the front cabinet 251 and the back cover 252.

The adhesive member 260 is disposed between the panel assembly 210 and the chassis base 220 to couple the chassis base 220 toward the panel assembly 210. The adhesive member 260 is formed along edges on the corresponding surfaces of the rear panel 212 and the chassis base 220. In one embodiment, the adhesive member 260 may be a sealant, a silicon adhesive, an acryl adhesive, or a dual-adhesive tape.

Figure 1:
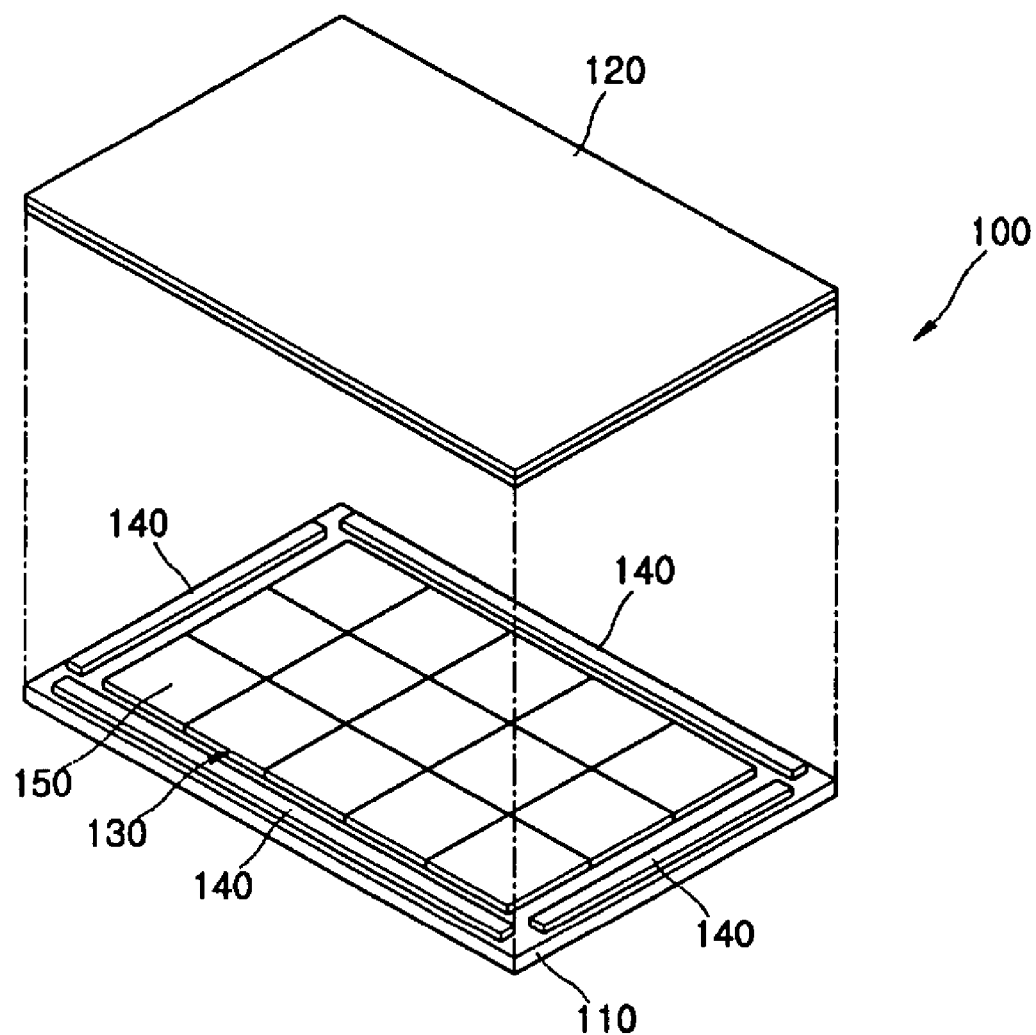
FIG. 1 is an exploded perspective view of a conventional plasma display panel assembly.

In addition, the heat dissipation sheet 310 is adhered onto the back surface of the rear panel 212. The heat dissipation sheet 310 is surrounded by the adhesive member 260, and formed as one sheet or a plurality of sheets (See FIG. 1).

The chassis base 220 supports the panel assembly 210, and also dissipates the heats generated from the panel assembly 210 during the driving operation to the outside. The chassis base 220 is formed to be separated a predetermined distance from the panel assembly 210 in order to form the air gap between the chassis base 220 and the panel assembly 210.

In one embodiment, the chassis base 220 includes a main body 221 formed of a metal plate having a high heat dissipation efficiency such as an aluminum plate. In one embodiment, upper and lower ends of the main body 221 are bent at about 90° toward the panel assembly 210 to form a first bent portion 222.

In this embodiment, a second bent portion 223 is formed by bending the first bent portion 222 at about 90° in parallel to the panel assembly 210, and a third bent portion 224 is formed by bending the second bent portion 223 at about 90° toward the opposite direction of the panel assembly 210. In one embodiment, the first through third bent portions 222-224 are integrally formed with each other from the main body 221.

The adhesive member 260 is disposed on the upper end portion of the back surface of the rear panel 212 and on the outer surface of the second bent portion 223. Accordingly, the panel assembly 210 and the main body 221 of the chassis base 220 are separated from each other as much as Δh as shown in FIG. 3. The heat dissipation sheet 310 attached on the back surface of the rear panel 212 is not actually adhered onto the main body 221 (See FIG. 3). Consequently, the air gap is formed between the chassis base 220 and the heat dissipation sheet 310.

In one embodiment, the air gap is formed in order to prevent the heat generated from the driving circuit unit 230 from being transmitted to the panel assembly 210 after passing through the chassis base 220 and the heat dissipation sheet 310, and prevent the heat from badly affecting the panel assembly 210.

In addition, the driving circuit unit 230 is coupled to the upper end of the back surface of the chassis base 220, and the connector 330 is mounted on the driving circuit unit 230. In addition, the flexible printed cable 270 is disposed on the upper ends of the panel assembly 210 and the chassis base 220 to electrically connect the panel assembly 210 and the driving circuit unit 232.

The flexible printed cable 270 includes at least one IC 271, a lead wire 272 connected to the IC 271, and a flexible film 273 covering the lead wire 272. An end of the cable 270 is connected to the electrode terminal of the panel assembly 210, and the other end is connected to the connector 330 of the driving circuit unit 230. The flexible printed cable 270 is bent so as to be located from the rear portion of the chassis base 220 to the panel assembly 210 while passing through the upper end of the chassis base 220.

Here, the location of the flexible printed cable 270 is decided by a protection unit in order not to be damaged by an outer force in the assembling process.

Figure 4:
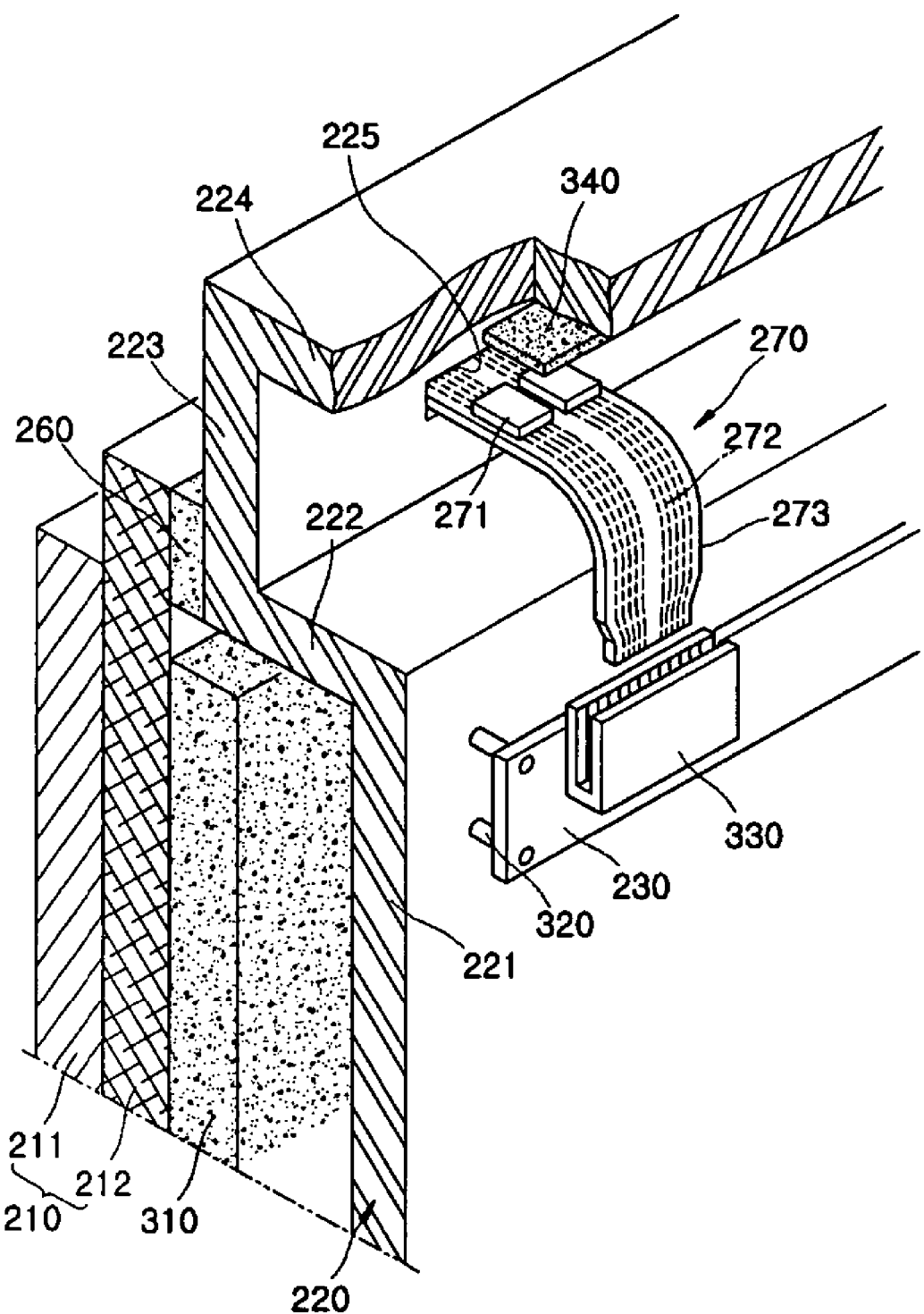
FIG. 4 is a perspective view of the heat dissipation structure shown in FIG. 3.

That is, as shown in FIG. 4, a penetration hole 225 of a predetermined size is formed on the second bent portion 223 of the chassis base 220. The end portion of the flexible printed cable 270 is pressed onto the electrode terminal of the panel assembly 210 by being heated using an anisotropic conductive film (ACF), and the other end is electrically connected to the connector 330 while passing through the penetration hole 225.

In addition, the IC 271 of the flexible printed cable 270 is located at the chassis base 220. That is, the IC 271 is attached inside the third bent portion 224. Here, an adhesive member 340 is disposed between the IC 271 and the third bent portion 224 in order to improve the adhesive force of the IC 271.

In one embodiment, the adhesive member 340 is formed of a material having a heat dissipation property, for example, a silicon adhesive, in order to dissipate the heat generated from the IC 271 to the outside through the chassis base 220. In one embodiment, the adhesive member 340 reduces the heat resistance between the IC 271 and the chassis base 220 so that the heat generated by the IC 271 can be transmitted to the chassis base 220 rapidly during driving the display panel.

As described above, since the end portion of the chassis base 220 protects the flexible printed cable 270 by surrounding the flexible printed cable 270, in one embodiment, an additional element, for example, a cover plate installed on the chassis base 220 to surround the flexible printed cable 270 is not required.

When the plasma display panel assembly 200 has a large size, a chassis enhancing member can be further installed on the upper and lower ends of the chassis base 220 in order to reinforce the strength of the assembly.

In the plasma display panel assembly 200 having the above structure, the heat generated from the panel assembly is dissipated through the heat dissipation sheet 310.

Here, since the air gap is formed between the panel assembly 210 and the chassis base 220, the heat generated from the panel assembly 210 is dissipated to the outer atmosphere through the heat dissipation sheet 310.

In addition, the heat generated from the driving circuit unit 230 installed on the back surface of the chassis base 220 is not transmitted to the panel assembly 210 due to the air gap between the panel assembly 210 and the chassis base 220.

The heat generated from the IC 271 of the flexible printed cable 270 is output to the outside through the chassis base 220 after passing through the adhesive member 340.

The heat output from the panel assembly 210 and the IC 271 is cooled down rapidly by convection of the air induced through the vent hole 253 formed on the back cover 252.

Figure 5:
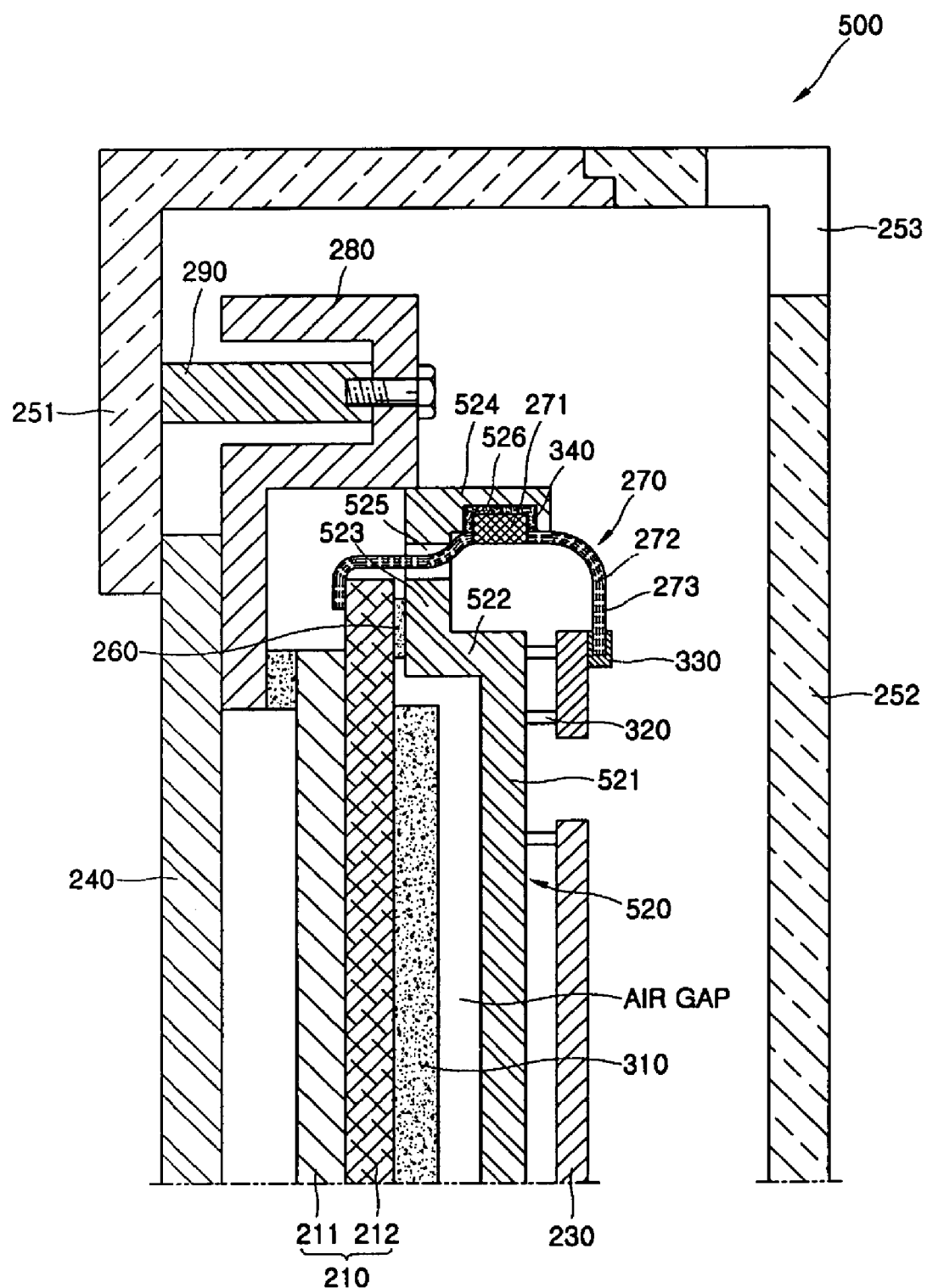
FIG. 5 is a cross-sectional view of a heat dissipation structure according to a second embodiment of the present invention.

FIG. 5 is a cross-sectional view of a plasma display panel assembly 500 according to a second embodiment of the present invention.

Referring to FIG. 5, a chassis base 520 is installed on a rear portion of the panel assembly 210. The chassis base 520 includes a main body 521 of a plate shape that is disposed in parallel to the panel assembly 210, and first through third bent portions 522-524 bent more than once at the upper and lower ends of the main body 521.

In one embodiment, the first bent portion 522 is bent at about 900 from the upper end of the main body 521 toward the panel assembly 210. In one embodiment, the second bent portion 523 is bent at about 900 in parallel to the panel assembly 210 from the first bent portion 522 and having a penetration hole 525. In one embodiment, the third bent portion 524 is bent at about 900 from the second bent portion 523 toward the opposite direction of the panel assembly 210.

An end of the flexible printed cable 270 is thermo-compressed onto the electrode terminal of the panel assembly 210 through the penetration hole 525, and the other end is connected to the connector 330 mounted on the driving circuit unit 230.

In one embodiment, an insertion recess 526 of a predetermined depth is formed on the third bent portion 524. The depth of the insertion recess 526 corresponds to the thickness of IC 271 of the flexible printed cable 270. Accordingly, the IC 271 is inserted into the insertion recess 526.

In addition, the adhesive member 340, which can dissipate heat, is applied in the insertion recess 526, and the IC 271 is attached onto the third bent portion 514 by the adhesive member 340. Since the adhesive member 340 is applied on the entire portion of the insertion recess 526, the adhesive member 340 can be applied not only on the bottom of the IC 271, but on the side surface of the IC 271.

Therefore, the IC 271 can be firmly attached onto the chassis base 520, and the heat can be transmitted toward the side surfaces of the IC 271, accordingly the heat dissipating efficiently can be improved.

Figure 6:
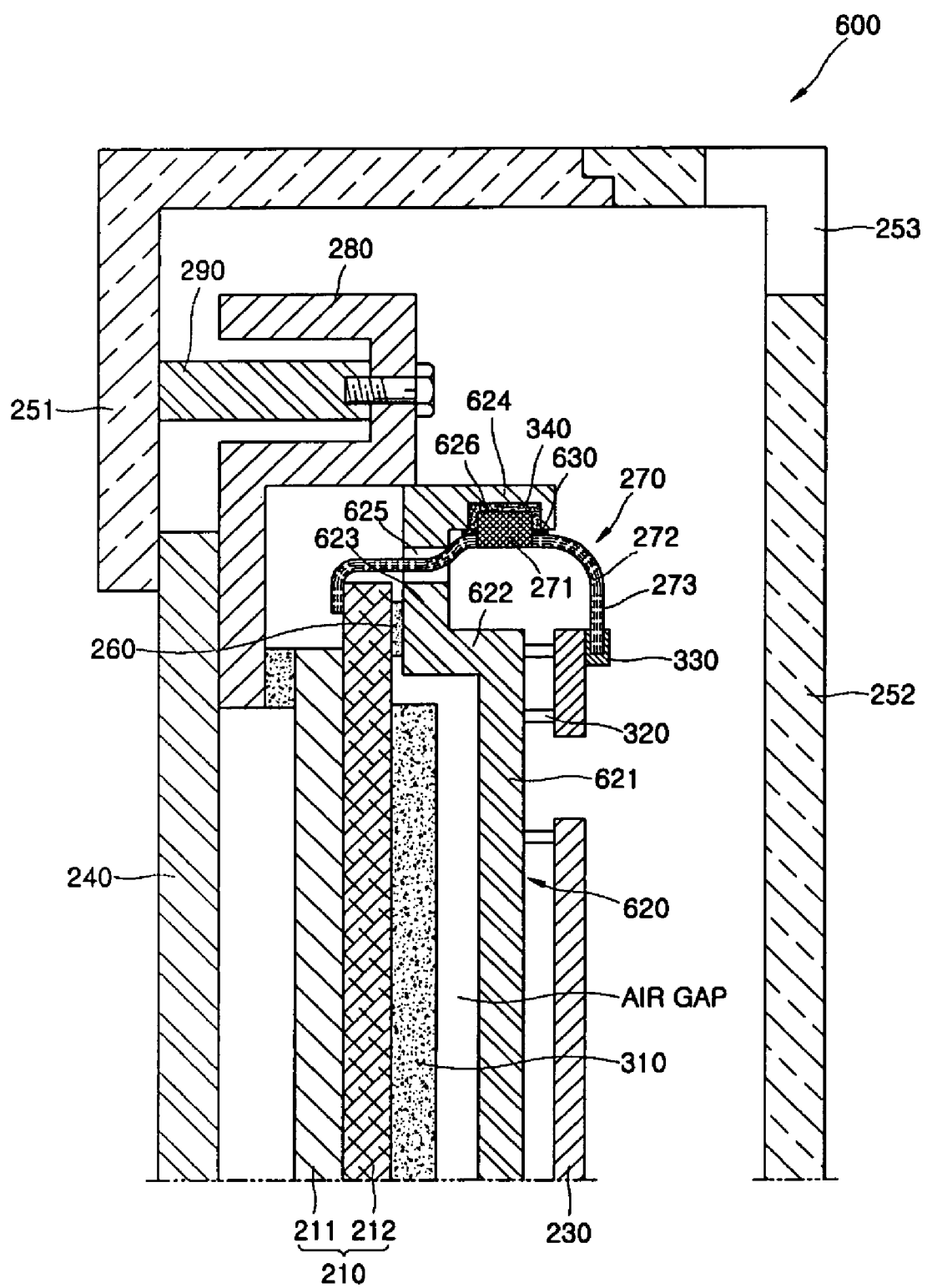
FIG. 6 is a cross-sectional view of a heat dissipation structure according to a third embodiment of the present invention.

FIG. 6 is a cross-sectional view of a plasma display panel assembly 600 according to a third embodiment of the present invention.

Referring to FIG. 6, a chassis base 620 is installed on the rear portion of the panel assembly 210, first through third bent portions 622~624 bent more than once are formed on upper and lower ends of the main body 621 of the chassis base 620 so as to form an air gap between the panel assembly 210 and the chassis base 620.

In one embodiment, an insertion recess 626 having a predetermined depth corresponding to the thickness of the IC 271 in the flexible printed cable 270 is formed at the third bent portion 624, and the IC 271 is attached into the insertion recess 626 by the adhesive member 340.

In addition, a second adhesive member 630 is applied around the IC 271 that protrudes inside the third bent portion 624. Since the second adhesive member 630 surrounds the IC 271 while maintaining an appropriate thickness thereof, the adhesive reliability of the IC 271 with respect to the chassis base 620 can be improved.

Figure 7:
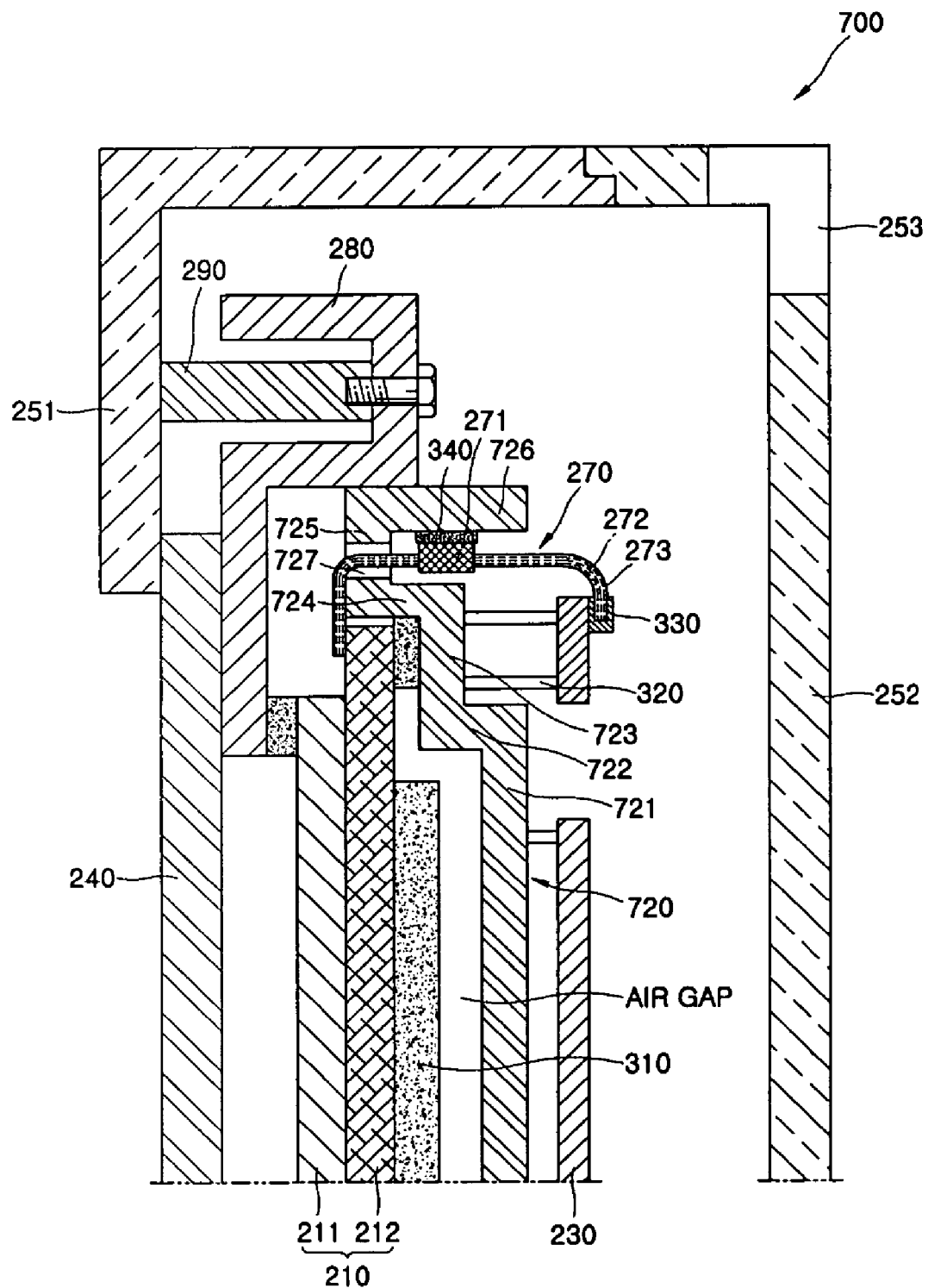
FIG. 7 is a cross-sectional view of a heat dissipation structure according to a fourth embodiment of the present invention.

FIG. 7 is a cross-sectional view of a plasma display panel assembly 700 according to a fourth embodiment of the present invention.

Referring to FIG. 7, a chassis base 720 is coupled to the rear portion of the panel assembly 210, and an air gap is formed between them. The chassis base 720 includes a main body 721 of a plate shape that is disposed in parallel to the panel assembly 210, and first through fifth bent portions 722~726 bent from the upper and lower ends of the main body 721 more than once.

In one embodiment, the first bent portion 722 is bent at about 90° from an end of the main body 721 toward the panel assembly 210, and the second bent portion 723 bent at about 90° from the first bent portion 722 in parallel to the panel assembly 210, and the third bent portion 724 bent at 90° from the second bent portion 723 toward the panel assembly 210 to surround the end portion of the rear panel 212. In one embodiment, the fourth bent portion 725 is bent at about 900 from the third bent portion 724 in parallel to the panel assembly 210 and having a penetration hole 727, and the fifth bent portion 726 bent at about 90° from the fourth bent portion 725 toward the opposite direction of the panel assembly 210.

An end of the flexible printed cable 270 is electrically connected to an electrode terminal of the panel assembly 210 through the penetration hole 727 formed at the fourth bent portion 725, and the other end is connected to the connector mounted on the driving circuit unit 230 installed at the back surface of the chassis base 720.

Here, the driving circuit unit 230 is not installed on the outer surface of the main body 721, but coupled to the outer surface of the second bent portion 723 by a boss 320. In addition, the adhesive member 260 is disposed on corresponding surfaces of the second bent portion 723 and the rear panel 212.

As described above, the chassis base 720 is manufactured by being drawn or bent so that the driving circuit unit 230 is attached to the second bent portion 723 and the third bent portion 724 surrounds the upper end of the panel assembly 210.

In one embodiment, an additional insertion recess having a predetermined depth corresponding to the thickness of the IC 271 is formed at the fifth bent portion 726, to which the IC 271 is attached, so that the IC 271 can be mounted through the insertion recess. In another embodiment, an adhesive member of a predetermined thickness can be further formed along the boundary of the IC 271 in order to improve the adhesive force. However, the chassis base 720 is not limited to the above structures.

Figure 8:
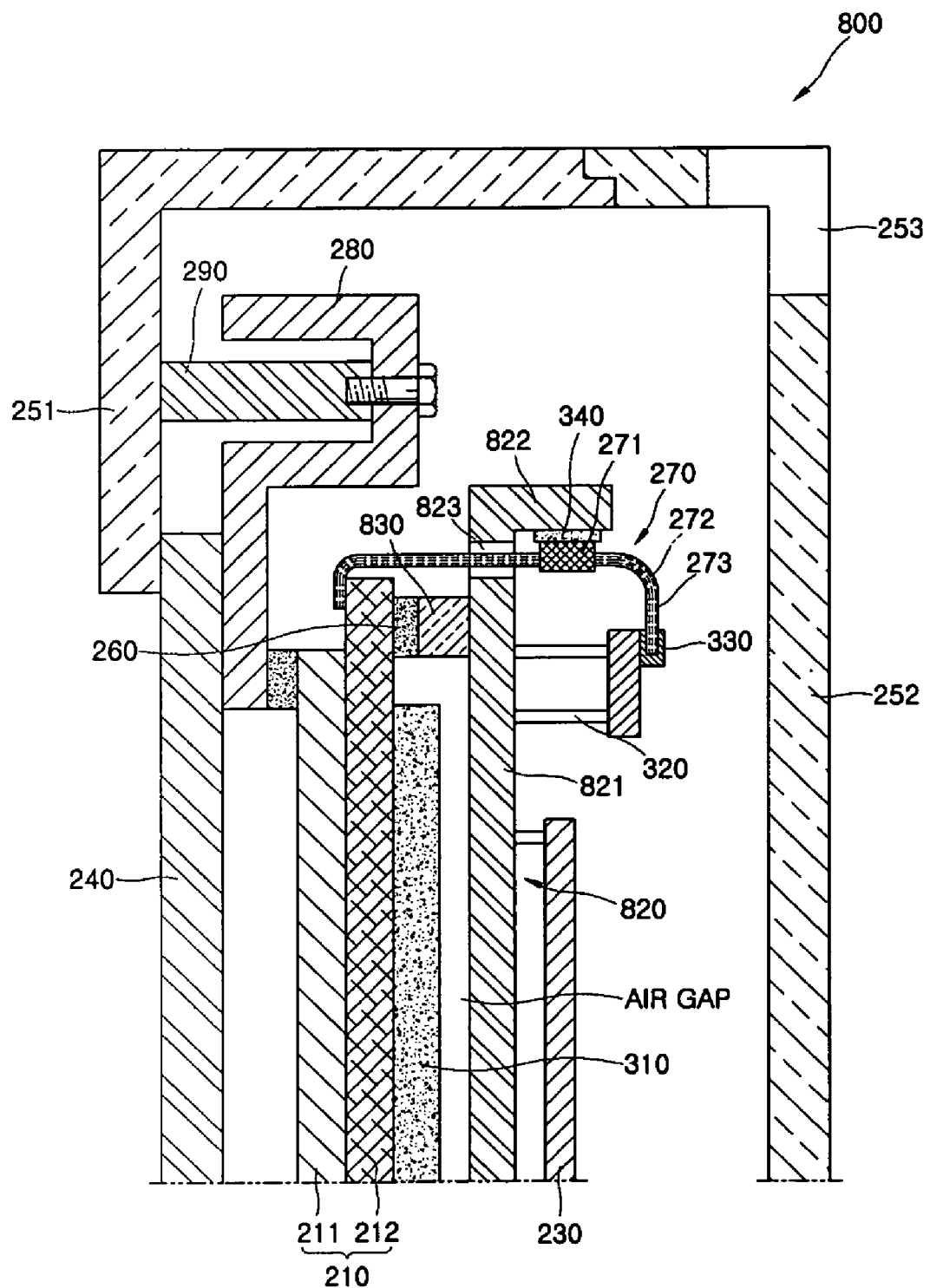
FIG. 8 is a cross-sectional view of a heat dissipation structure according to a fifth embodiment of the present invention.

FIG. 8 is a cross-sectional view of a plasma display pane assembly 800 according to a fifth embodiment of the present invention.

Referring to FIG. 8, a chassis base 820 is installed on the rear portion of the panel assembly 210. The chassis base 820 includes a main body 821 of a plate shape that is disposed in parallel to the panel assembly 210, and a bent portion 822 bent from the upper and lower ends of the main body 821 toward the opposite direction of the panel assembly 210. A penetration hole 823 of a predetermined size is formed at the upper end of the main body 821. In addition, the adhesive member 260 is disposed on the corresponding surfaces of the rear panel 212 and the main body 821.

In one embodiment, in order to form an air gap between the panel assembly 210 and the chassis base 820, a plate 830 of a predetermined thickness is formed between the adhesive member 260 and the main body 821. Due to the plate 830, the panel assembly 210 and the chassis base 820 are separated a predetermined distance from each other to form the air gap. The plate 830 is coupled to the chassis base 820 by a fixing member, for example, a screw or a rivet. In addition, the heat dissipation sheet 310 attached on the outer surface of the rear panel 212 is not adhered to the chassis base 820.

In addition, an end of the flexible printed cable 270 is electrically connected to an electrode terminal of the panel assembly 210 through the penetration hole 823, and the other end is electrically connected to the connector 330 mounted on the driving circuit unit 230 that is coupled to the back surface of the chassis base 820.

In addition, the IC 271 of the flexible printed cable 270 is located at the inner surface of the bent portion 822, and the adhesive member 340 is disposed between the bent portion 822 and the IC 271.

As described above, the plate 830 of a predetermined thickness is disposed between the panel assembly 210 and the chassis base 820 to form the air gap, and the IC 271 is attached inside of the bent portion 822 of the chassis base 820.

According to embodiments of the present invention, the following effects can be obtained.

Since the air gap is formed between the panel assembly and the chassis base, the heat generated by the driving circuit unit that is attached at the back surface of the chassis base is not directly transmitted to the panel assembly.

In addition, since the heat dissipation sheet is attached on the back surface of the panel assembly, the heat output through the heat dissipation sheet is thermally exchanged with the outer air induced through the air gap, thus the temperature of the panel assembly is rapidly cooled down.

Since the end portion of the chassis base is bent and the IC of the flexible printed cable is attached onto the bent portion, the heat generated from the IC can be effectively dissipated without an additional cover plate.

Also, the bent portion of the chassis base surrounds the IC, therefore the damage of IC can be prevented in advance. In addition, since the IC is attached onto the chassis base by an adhesive member having the heat dissipating property, the heat resistance between the IC and the chassis base can be prevented.

In addition, the insertion recess having a depth corresponding to the thickness of an IC is formed on the chassis base and the IC is mounted onto the chassis base through the insertion recess, the adhesive member can be applied on the side of the IC, thus increasing the heat dissipation efficiency.

An additional adhesive member having a predetermined thickness is attached along the boundary of the IC that is attached onto the chassis base, thus the adhesive reliability can be improved. In addition, the thickness of the dual-adhesive tape disposed between the panel assembly and the chassis base can be reduced.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display panel assembly, comprising:
   a panel assembly having a front panel and a rear panel coupled to the front panel;
   a chassis base configured to support the panel assembly;
   a driving circuit unit attached on a back surface of the chassis base; and
   a flexible printed cable configured to electrically connect the panel assembly and the driving circuit unit, which is configured to transmit circuitry driving signals,
   wherein an air gap is formed between the panel assembly and the chassis base, and wherein the chassis base includes i) main body separated a predetermined distance from the panel assembly in order to form the air gap, and ii) a plurality of bent portions each of which is bent more than once along the main body to be coupled to the panel assembly.

2. The assembly of claim 1, further comprising a heat dissipation sheet which is attached on the outer surface of the panel assembly that faces the main body so as not to contact the chassis base.

3. The assembly of claim 1, further comprising an adhesive member having a heat dissipating property which is disposed between the bent portion and the panel assembly in order to fix the chassis base with respect to the panel assembly.

4. A plasma display panel assembly, comprising:
   a panel assembly having a front panel and a rear panel coupled to the front panel;
   a chassis base configured to support the panel assembly;
   a driving circuit unit attached on a back surface of the chassis base; and
   a flexible printed cable configured to electrically connect the panel assembly and the driving circuit unit, which is configured to transmit circuitry driving signals,
   wherein an air gap is formed between the panel assembly and the chassis base,
   wherein the chassis base includes a main body separated a predetermined distance from the panel assembly in order to form the air gap, and a bent portion bent more than once from upper and lower ends of the main body to be coupled to the panel assembly,
   wherein the bent portion includes a penetration hole in order to receive the flexible printed cable inside thereof, and the flexible printed cable is installed through the penetration hole, and wherein an end of the flexible printed cable is connected to a connector of the driving circuit unit and the other end is connected to a terminal of the panel assembly.

5. The assembly of claim 4, further comprising a first adhesive member having a heat dissipation property which is disposed between the bent portion and an integrated circuit (IC) of the flexible printed cable so that the IC is fixed on the chassis base.

6. The assembly of claim 5, further comprising a second adhesive member which is formed along the boundary of the IC on a surface of the bent portion.

7. The assembly of claim 4, wherein the bent portion includes an insertion recess having a depth, in which an integrated circuit (IC) of the flexible printed cable can be mounted, and the IC is fixedly inserted into the insertion recess.

8. The assembly of claim 7, further comprising a first adhesive member which is applied in the insertion recess in order to fix the IC onto the chassis base.

9. The assembly of claim 8, further comprising a second adhesive member which is further applied on the surface of the bent portion along the boundary of the IC.

10. A plasma display panel assembly, comprising:
    a panel assembly having a front panel and a rear panel coupled to the front panel;
    a chassis base configured to support the panel assembly;
    a driving circuit unit attached on a back surface of the chassis base; and
    a flexible printed cable configured to electrically connect the panel assembly and the driving circuit unit, which is configured to transmit circuitry driving signals,
    wherein an air gap is formed between the panel assembly and the chassis base,
    wherein the chassis base includes a main body disposed in parallel to the panel assembly, a bent portion bent more than once from the upper and lower ends of the main body, and wherein a plate of a predetermined thickness is installed between the chassis base and the panel assembly in order to form an air gap so that a predetermined distance is maintained between the chassis base and the panel assembly.

11. The assembly of claim 10, further comprising a penetration hole which is formed on the main body, wherein the flexible printed cable is installed through the penetration hole, and wherein an end of the flexible printed cable is connected to a connector of the driving circuit unit and the other end is connected to a terminal of the panel assembly.

12. The assembly of claim 11, wherein the IC of the flexible printed cable is fixed at an inner surface of the bent portion by an adhesive member having a heat dissipating property.

13. A plasma display panel assembly, comprising:
    a panel assembly having a front panel and a rear panel coupled to the front panel;
    a chassis base configured to support the panel assembly;
    a driving circuit unit attached on a back surface of the chassis base; and
    a flexible printed cable configured to electrically connect the panel assembly and the driving circuit unit, which is configured to transmit circuitry driving signals,
    wherein an air gap is formed between the panel assembly and the chassis base,
    wherein the chassis base includes i) a main body of plate type that is separated a predetermined distance from the panel assembly in order to form an air gap between the chassis base and the panel assembly, and ii) a bent portion bent more than once from the upper and lower ends of the main body, and wherein the flexible printed cable is installed inside the bent portion.

14. The assembly of claim 13, wherein an end of the flexible printed cable is connected to a connector of the driving circuit unit and the other end is connected to an electrode terminal of the panel assembly through a penetration hole formed on the bent portion, and an integrated circuit (IC) of the flexible printed cable is fixed on the bent portion by an adhesive member having a heat dissipating property.

15. The assembly of claim 14, further comprising an insertion recess having a depth corresponding to the thickness of the IC formed on the bent portion, and the IC is fixed by an adhesive member applied in the insertion recess.

16. A plasma display panel assembly, comprising:
a panel assembly having a front panel and a rear panel coupled to the front panel; and
a chassis base configured to support the panel assembly,
wherein an air gap is formed between the panel assembly and the chassis base,
and wherein the chassis base includes i) a main body separated a predetermined distance from the panel assembly in order to form the air gap, and ii) a plurality of bent portions each of which is bent more than once along the main body to be coupled to the panel assembly.

17. A heat dissipation structure for a plasma display panel assembly, the structure comprising:
a chassis base including a body portion and a plurality of bent portions connected to the body portion, wherein each of the bent portions is bent more than once along the body portion and is configured to support a panel assembly, and wherein the body portion is configured to face a heat dissipation sheet attached to the panel assembly without directly contacting the heat dissipation sheet.

* * * * *

UNITED STATES PATENT AND TRADEMARK OFFICE
CERTIFICATE OF CORRECTION

PATENT NO. : 7,423,878 B2  Page 1 of 1
APPLICATION NO. : 11/158541
DATED : September 9, 2008
INVENTOR(S) : Ki-Jung Kim It is certified that error appears in the above-identified patent and that said Letters Patent is hereby corrected as shown below:

| Column | Line | |
|---|---|---|
| 6 | 40 | Change "900" to --90°--. |
| 6 | 42 | Change "900" to --90°--. |
| 6 | 45 | Change "900" to --90°--. |
| 7 | 39 | Change "900" to --90°--. |
| 9 | 29 | In Claim 1, change "main" to --a main--. |

Signed and Sealed this

Fourteenth Day of April, 2009

JOHN DOLL
*Acting Director of the United States Patent and Trademark Office*